United States Patent [19]

Weiss

[11] Patent Number: 5,723,033
[45] Date of Patent: Mar. 3, 1998

[54] DISCRETE TRACK MEDIA PRODUCED BY UNDERLAYER LASER ABLATION

[75] Inventor: Joel R. Weiss, Fremont, Calif.

[73] Assignee: Akashic Memories Corporation, San Jose, Calif.

[21] Appl. No.: 524,725

[22] Filed: Sep. 6, 1995

[51] Int. Cl.$^6$ .................... C23C 14/34; B05D 3/00
[52] U.S. Cl. ............... 204/192.15; 204/192.16; 204/192.2; 427/129; 427/130; 427/131; 427/596; 427/554; 427/555; 216/65; 216/94
[58] Field of Search ............ 204/192.2, 192.16, 204/192.15; 427/554, 555, 596, 129, 130, 131; 216/65, 94; 428/694 T, 694 TS, 694 TB, 694 TC, 694 TR, 694 BR, 694 SG; 360/135

[56] References Cited

U.S. PATENT DOCUMENTS

| | | | |
|---|---|---|---|
| 4,833,020 | 5/1989 | Shiroishi et al. | 427/131 |
| 4,893,299 | 1/1990 | Humberstone et al. | 369/275 |
| 5,062,021 | 10/1991 | Ranjan et al. | 360/135 |
| 5,108,781 | 4/1992 | Ranjan et al. | 427/130 |
| 5,344,720 | 9/1994 | Belt et al. | 427/130 |
| 5,567,484 | 10/1996 | Baumgart et al. | 427/555 |

FOREIGN PATENT DOCUMENTS

| | | | |
|---|---|---|---|
| 0 652 554 A1 | 10/1995 | European Pat. Off. | |
| 4-157619 | 5/1992 | Japan | 428/694 TS |
| 180330 | 3/1992 | Taiwan | G11B 7/26 |

OTHER PUBLICATIONS

D. Dericotte et al., "Advancements in the Development of Plastic Hard Disks with Pre-Embossed Servo Patterns," Corporate Research Laboratories, SONY Corporation.

S.E. Lambert et al., "Beyond Discrete Tracks: Other Aspects of Patterned Media," *J. Appl. Phys.* 69 (8), Apr. 1991, pp. 4724–4726.

*Primary Examiner*—R. Bruce Breneman
*Assistant Examiner*—Rodney G. McDonald
*Attorney, Agent, or Firm*—Townsend and Townsend and Crew LLP

[57] ABSTRACT

The invention provides discrete track magnetic recording media and methods for their fabrication. A discrete track servo pattern is imposed on an underlayer, over which a magnetic recording layer is deposited. The pattern is preferably imposed by selective laser ablation of the underlayer. Ideally the underlayer comprises sputtered carbon, which has been found to improve the signal-to-noise ratio of the subsequent magnetic layer. Optionally, a contact start/stop zone having a relatively rough surface texture is imposed, also by selective laser ablation of the underlayer.

8 Claims, 2 Drawing Sheets

DISCRETE TRACK MEDIA PRODUCED BY UNDERLAYER LASER ABLATION

BACKGROUND OF THE INVENTION

1. Field of the Invention

The present invention relates generally to magnetic recording media, and more particularly to magnetic recording disks having discrete servo tracks formed by laser ablation of a carbon underlayer.

Thin film magnetic recording disks generally comprise a disk substrate having a magnetic layer and a number of underlayers and overlayers deposited thereon. The nature and composition of each layer is selected to provide desired magnetic recording characteristics, as generally recognized in the industry. An exemplary present day thin film disk is illustrated in FIG. 1 and comprises a non-magnetic disk substrate 10, typically composed of an aluminum alloy. An amorphous nickel phosphorous (Ni-P) underlayer 12 is formed over each surface of the disk substrate 10, typically by plating and is subsequently polished and sometimes texturized prior to deposition of the additional films. The Ni-P layer is hard, and imparts rigidity to the aluminum substrate. Alternatively, glass and other non-metallic materials are now used to form highly rigid disk substrates. A second underlayer in the form of a chromium ground layer 14 is formed over the Ni-P layer 12, typically by sputtering, and a magnetic layer 16 is formed over the ground layer 14. The magnetic layer 16 comprises a thin film of ferromagnetic material, such as a magnetic oxide or magnetic metal alloy. Usually, a protective layer 18, such as a carbon film, is formed over the magnetic layer 16 and a lubricating layer 20 is formed over the protective layer.

The presence of the Ni-P underlayer 12, together with the chromium ground layer 14, has been found to improve the recording characteristics of the magnetic layer 16. In particular, the chromium ground layer formed over a Ni-P layer provides enhanced coercivity and reduced noise characteristics. Such improvements are sometimes further enhanced when the Ni-P underlayer is treated by mechanical texturing to create a roughened surface prior to formation of the chromium ground layer. The texturing may be circumferential or crosswise, with the preferred geometry depending on the particular composition of the cobalt-containing magnetic layer.

The outer carbon protective layer 18 serves a very different purpose. This protective layer has been found to greatly extend the life of magnetic recording media by reducing disk wear. Carbon has been shown to provide a high degree of wear protection when a thin lubrication layer 20 is subsequently applied.

Such magnetic recording disk constructions have been very successful and allow for high recording densities. As with all successes, however, it is presently desired to provide magnetic recording disks having even higher recording densities. One method for increasing the areal density on rigid magnetic disks involves patterning the surface of a thin film disk to form discrete data tracks. Such "discrete track media" typically include surface geometry data which are utilized by the hard disk drive servo mechanism, allowing specific recording tracks to be identified, and providing feedback to improve the accuracy of read/write head tracking.

Such discrete track media, however, suffer from their own disadvantages. The surface patterns of discrete track media have generally been imposed using standard lithographic techniques to remove material from the magnetic recording layer or by creating recessed zones or valleys in the substrate prior to deposition of the magnetic material. In the former case, the magnetic recording material is etched or ion milled through a resist mask to leave a system of valleys which are void of magnetic material. In the latter case, the magnetic film, subsequently applied, is spaced far enough away from the recording head that the flux from the head does not sufficiently "write" the magnetic medium. Servo track information can be conveyed by the difference in magnetic flux at the boundary between the elevatored patterns and the valleys. However, the boundary signals have at most 50% of the amplitude of conventionally recorded data. Additionally, fabrication of production quantities of discrete track media has remained problematic, due in part to the expense of the required lithographic processes.

It has recently been proposed to produce discrete track magnetic recording media through the use of a pre-embossed rigid former magnetic disk. The surface pattern would be directly imprinted on a substrate using a stamping process. Thin film magnetic recording layers could then be sputtered over the patterned surface of the substrate, producing discrete track media having a continuous magnetic layer extending over both the elevated regions and the recessed zones or valleys. Unfortunately, the stamping process inherently requires elevated temperatures and pressures, and is susceptible to warping. Additionally, the intricate pattern must be first precisely imprinted on the stamping plate, as the stamping process will reproduce any flaws or contaminants present on the stamping plates. Development of discrete track media using such a stamping process is particularly problematic, as each test pattern requires production of an expensive stamping tool.

For these reasons, it would be desirable to provide an improved method for producing a discrete track servo pattern for discrete track media. It would be particularly desirable if such a method provided the accuracy and reproducability of lithography, but did not involve multiple process steps or the complex, dedicated tooling required for stamping. It would be best if such a method enhanced the improvements to the magnetic recording characteristics available using the conventional underlayers, magnetic recording layers, and overlayers of high density magnetic recording media.

2. Description of the Background Art

The production of discrete track media and other magnetic recording media having patterned surfaces were described by S. E. Lambert et al. in *Beyond Discrete Tracks: Other Aspects of Patterned Media*, JOURNAL OF APPLIED PHYSICS, Vol. 69, 8:4724–26, Apr. 15, 1991. Each of the patterned media described were produced by sputter etching or ion milling a magnetic recording layer through a resist mask. The resist mask was written with an electron beam, as is known in the lithographic arts.

The production of discrete track media through the use of a pre-embossed rigid magnetic disk was described by D. Dericotte, et al., in *Advancements in the Development of Plastic Hard Disks With Pre-embossed Servo Patterns*, CORPORATE RESEARCH LABORATORIES, SONY CORPORATION. The disk is produced using an injection molding process between two stamping plates. The plates containing the media surface pattern are produced using lithographical techniques.

Recording media having a selectively laser-textured surface and methods for their production are described in U.S. Pat. Nos. 5,062,021, and 5,108,781, respectively. A laser system for texturing a substrate, Ni-P layer, or a magnetic recording layer is also disclosed.

SUMMARY OF THE INVENTION

In a first aspect, magnetic recording media according to the principles of the present convention comprise a rigid substrate having a substantially flat surface, and an underlayer having a discrete servo track pattern disposed over the flat surface of the substrate. A magnetic recording layer is disposed over the underlayer, and thereby reflects the discrete track pattern of the underlayer. Therefore, the discrete track pattern can be imposed without resorting to lithographically reproducing the pattern and etching the magnetic recording layer on each disk.

Preferably, the discrete servo track pattern is imposed on the underlayer at least in part by selective laser ablation. Thus, the pattern is imposed directly on the underlayer, avoiding the danger of producing a large number of defective disks from a single defective or contaminated plate. Additionally, expensive specialized tools are not required for each pattern, as alternative patterns may be imposed simply by varying the laser ablation pattern, making the magnetic recording media of the present invention particularly well suited for specialized short production runs, for example, in fabricating disks for pattern development testing.

A particularly advantageous material for use as an underlayer in the present recording media comprises carbon, ideally being sputtered from a sputtering source composed of at least 99.9% pure carbon. Such a carbon underlayer has been found to provide an improved signal-to-noise ratio for subsequent magnetic recording layers.

Generally, the discrete track pattern comprises recessed zones and raised zones. Typically, the raised zones are used for data storage. Servo track information may optionally be conveyed as discrete raised portions within a generally recessed servo data zone, or may alternatively be magnetically stored within the recessed zone. Preferably, the underlayer comprises carbon with a thickness in the range between 0 Å and 400 Å within the recessed zones, ideally being between 50 Å and 400 Å to optimize the magnetic recording characteristics of the servo data. The use of such a carbon underlayer is particularly advantageous when disposed over a non-metallic substrate.

In another aspect, the present invention provides magnetic recording media comprising a substrate and a carbon underlayer disposed over the substrate. The underlayer includes a surface with a discrete servo track pattern, which pattern is imposed at least in part by selective laser ablation of the underlayer. A magnetic recording layer is disposed over the surface of the underlayer. Generally, a layer comprising chromium or an alloy with chromium is disposed over the underlayer and below the magnetic layer to improve the magnetic recording characteristics. Similarly, a protective outer layer will often be disposed over the magnetic layer to improve durability. The protective layer may be formed by a method similar to that used for the underlayer, typically by sputter deposition. This eliminates the need for additional thin film deposition equipment or techniques.

A method for fabricating a magnetic recording media according to the principles of the present convention comprises depositing an underlayer over a substrate surface, and selectively laser ablating the underlayer. A magnetic recording layer is deposited over the underlayer surface. Generally, the ablating step comprises producing a surface with a discrete servo track pattern, preferably by selective ablation of a carbon underlayer. Advantageously, the laser type may be specified based at least in part on the absorption spectra of the underlayer material.

Optionally, the ablating step comprises texturing the underlayer surface to improve recording head glide characteristics, ideally by texturing a contact start/stop zone with a surface roughness greater than a data zone. The methods of the present invention may thereby make use of the flexibility of laser ablation to optimize the surfaced topology of magnetic recording media. Specifically, magnetic recording media surface roughness is dictated by the conflicting constraints of data storage, which generally benefits from low surface roughness, and durability, which requires a relatively high surface roughness to minimize stiction and provide an adequate air bearing during head takeoff and landing. Laser ablation provides a highly controlled texturing process, and thereby facilitates the formation of a separate data zone and contact start/stop zone over different portions of the magnetic recording surface to resolve these conflicting surface texture limitations.

DETAILED DESCRIPTION OF THE SPECIFIC EMBODIMENTS

Figure 2:
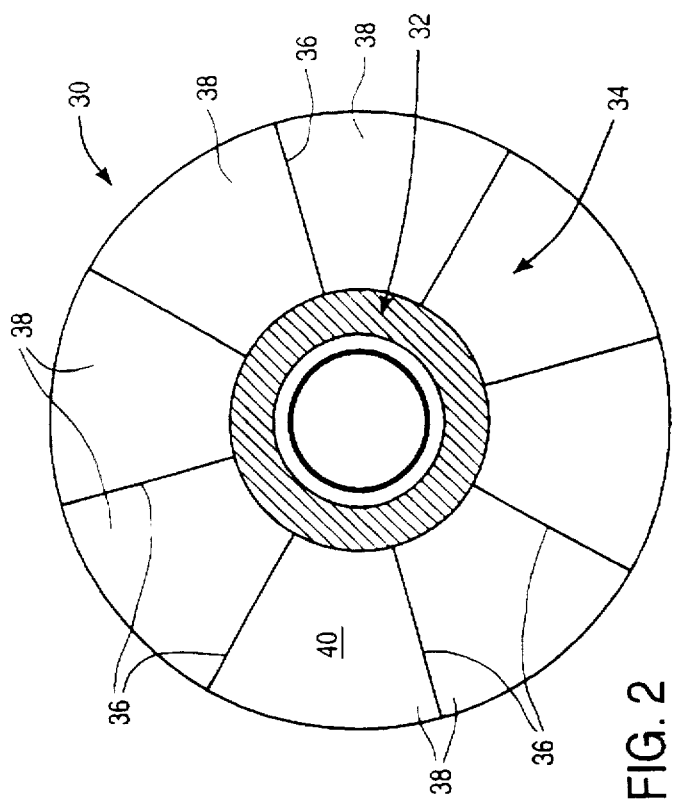
FIG. 2 schematically illustrates a magnetic recording disk having discrete servo tracks and a contact start/stop zone according to the principles of the present invention.

Referring now to FIG. 2, magnetic recording media according to the present invention will usually be in the form of a magnetic recording disk 30 having a contact start/stop zone 32 and a data zone 34. These zones are distinguished by the surface texture, as more fully described in co-pending U.S. patent application Ser. No. 08/503,785, the full disclosure of which is herein incorporated by reference.

A discrete servo track pattern 40 has been imposed over the surface of data zone 34. Discrete servo track pattern 40 includes a number of data track zones 38 which are separated by a plurality of servo tracking zones 36. The data storage function of disk 30 is typically confined to data track zones 38, while servo tracking zones 36 provide information to the disk drive which allows a read/write head to maintain alignment on the individual, tightly-spaced discrete data tracks.

Although a relatively low number of servo tracking zones are illustrated, it should be understood that discrete track media patterns may include several hundred servo zones to improve head tracking during each rotation. Additionally, the servo tracking zones need not be straight radial zones as shown, but may instead comprise arcs, intermittent zones, or even irregularly-spaced zones separating individual data tracks.

Figure 3:
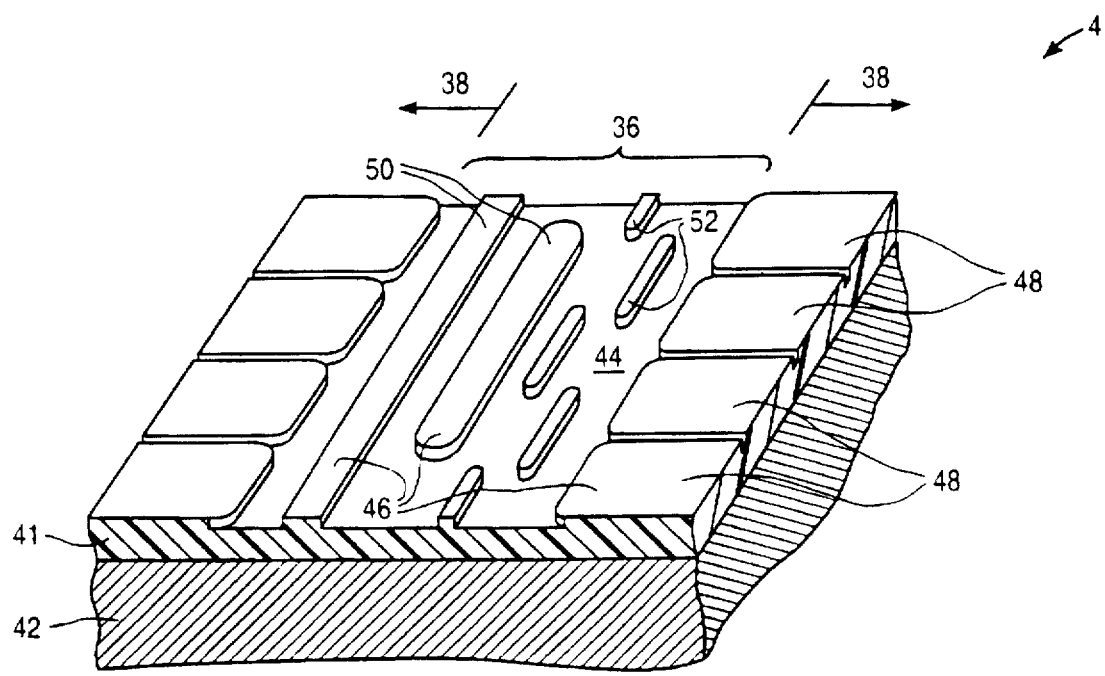
FIG. 3 is a perspective view showing a servo data zone within the discrete servo track pattern of the magnetic recording disk FIG. 2.

Referring now to FIG. 3, an enlarged portion of discrete servo track pattern 40 is shown imposed on the recording media layer structure 41, which in turn is disposed on a discrete track media substrate 42. The elements of pattern 40 are generally defined by a difference in height between recessed zones 44 and raised zones 46. Pattern 40 includes discrete track zones 38 separated by servo tracking zone 36.

The individual data tracks 48 comprise raised zones on which the data are magnetically stored. Such discrete data tracks offer a number of advantages over contiguous surface media, including a reduction in signal-to-noise ratio, specifically achieved by lowering edge noise between the physically separated tracks. In addition, discrete track patterns allow the inclusion of servo tracking zones having servo tracking data which is permanently coordinated with the individual data tracks.

Servo tracking zone 36 generally includes track ID bars 50 and tracking position bars 52. ID bars 50 provide the identification for each of the discrete tracks 48 of the discrete track pattern 40. Optionally, ID bars 50 comprise raised zones of a specific number and location for each data track 48, so that the track ID data is permanently imposed with the pattern. Where track ID is imposed with the pattern, a much larger number of discrete track bars are required than are shown in FIG. 3. Alternatively, track identification information may be magnetically recorded, either on a limited number of discrete raised track bars as shown, or, alternatively, entirely within the recessed zone 44. Where track identification is magnetically recorded, a limited number of ID bars 50 are required, as seen in FIG. 3. ID bars may be eliminated entirely by storing the data magnetically within recessed zone 44.

Tracking bars 52 provide the disk drive with feedback of the accuracy with which the read/write head is tracking an individual discrete track 48. Typically, tracking bars 52 extend approximately to the middle of the path defined by each track 48. Tracking bars 52 are staggered, so that each discrete track includes at least one tracking bar extending from the middle of the track path toward the disk axis, and one tracking bar which extends from the middle of the track path radially outward. By balancing the signal strength of the inward and outward staggered tracking bars, the read/write head can be accurately positioned within the center of the discrete track path. Typically, multiple staggered tracking bars are included in each servo data zone to improve tracking accuracy.

As described above, the tracking bars need not be physically raised zones, but may instead comprise permanently and accurately magnetically recorded areas within recessed zone 44. The use of ID bars and tracking bars was more fully described by S. E. Lambert, in *Beyond Discrete Tracks: Other Aspects of Patterned Media*, JOURNAL OF APPLIED PHYSICS, 69:4724–26, Apr. 15, 1991, the full disclosure of which is herein incorporated by reference.

Figure 4:
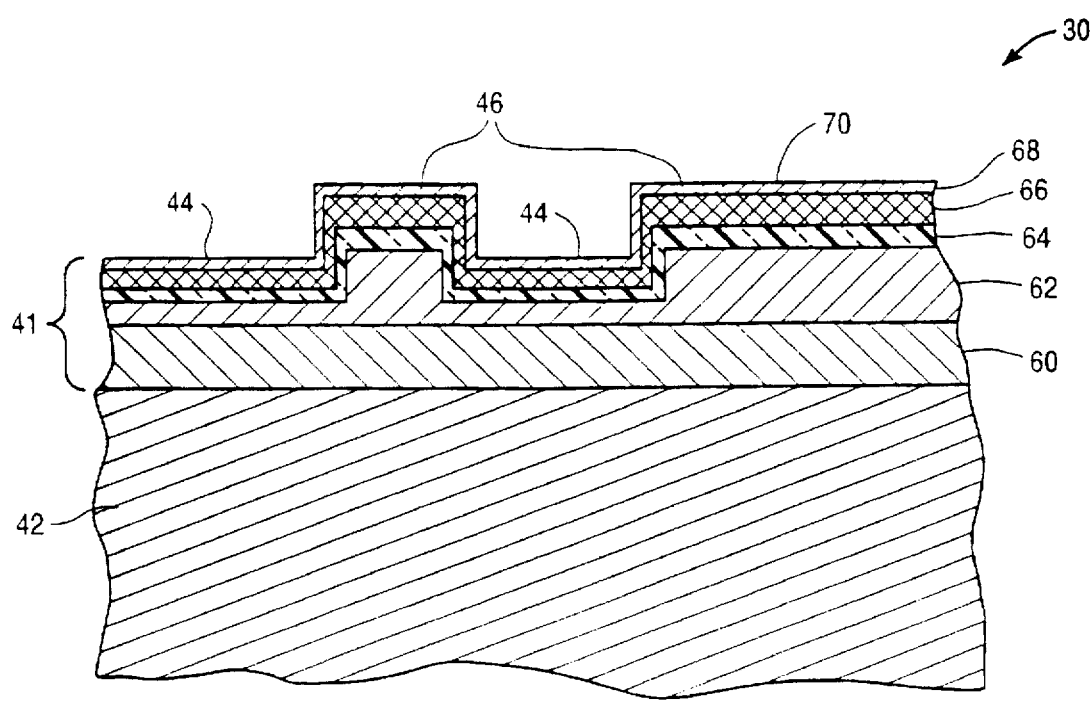
FIG. 4 is a cross-sectional view showing the layer structure of the discrete servo track pattern of FIG. 3.

Referring now to FIG. 4, the structure of disk 30 generally comprises substrate 42 and structural layers 41. In turn, structural layers 41 typically comprise an Ni-P layer 60 disposed over substrate 42, a carbon underlayer 62, a chromium ground layer 64, a magnetic recording layer 66, a protective carbon outer layer 68, and a lubricating layer 70.

Figure 1:
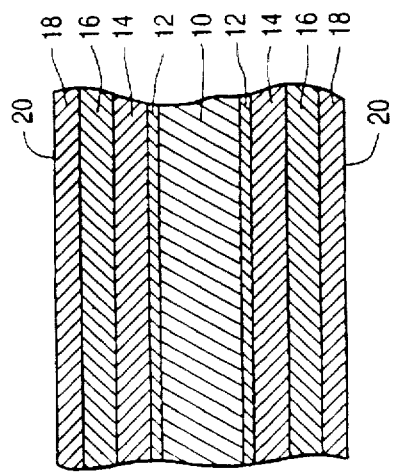
FIG. 1 is a cross-sectional view of an exemplary prior art magnetic recording disk, as described in the background section hereinabove.

The presence of Ni-P layer 60 is optional, depending, in part, on the material used for substrate 42. Where a conventional aluminum substrate is selected, a reinforcing Ni-P layer provides the advantages described above regarding FIG. 1. Where a glass or other non-metallic substrate is used, the Ni-P layer may be eliminated. Irregardless, the outer surface of substrate 42 or Ni-P layer 60 may optionally be textured using conventional techniques, as described hereinabove. Although the outer surface may include the increased surface roughness of texturing, the pattern has not yet been imposed. Thus, the outer surface remains "substantially planar" as that term is used herein. Alternatively, some portion of the pattern may be imposed on this intermediate surface. For example, recessed radial servo tracking zones might be stamped into a non-metallic substrate, while the discrete tracks are imposed on the underlayer using the method of the present invention.

Carbon underlayer 62 is generally sputtered without electrical biasing, although the substrate is preferably heated. After sputtering, the underlayer typically has a substantially planar outer surface. It is this carbon underlayer surface which receives the discrete track pattern.

To impose the pattern on the underlayer surface, a laser selectively ablates the underlayer material. The laser is computer controlled by a system similar to that used to create raised "bumps" in the polished Ni-P surface for "laser zone texture" or to direct an electron beam as in electron beam lithography. Laser zone texturing systems suitable to modify for production of the recording media of the present invention are described in U.S. Pat. Nos. 5,062,021 and 5,108,781, and in published European Patent Application No. 94308034.1, the full disclosures of which are herein incorporated by reference. Advantageously, the pattern is written directly to the underlayer material, eliminating the need for developing, etching, and the other intermediate lithographic process steps. Optionally, the laser is further directed over the surface of raised zones 46 or recessed zones 44 (see FIG. 3) to provide an optimized texture, as described hereinbelow.

The choice of the laser type is preferably determined by the absorption spectra of the underlayer. For example, if the carbon underlayer film energy absorption at 10.6 μm (infrared wavelengths) is acceptable, then a $CO_2$ laser would be a suitable choice. However, if the energy absorption is significantly better within the ultraviolet range, an ultraviolet laser should be selected. Similarly, this energy absorption spectra may promote the use of alternative layer materials. For example, in copending U.S. patent application Ser. No. 08/435,440, now issued as U.S. Pat. No. 5,599,632, the full disclosure of which is herein incorporated by reference, it was proposed that a silicon underlayer would offer signal-to-noise improvements similar to that provided by a carbon underlayer. Hence, if the absorption spectra of silicon offered significant advantages over that of carbon for available laser wavelengths, the fabrication advantages of silicon laser ablation would then promote the use of a silicon underlayer to optimize the speed of selective underlayer material removal during imposition of the pattern.

Ground layer 64 is typically sputtered over the pattern surface of carbon underlayer 62. Magnetic recording layer 66, typically comprising a cobalt alloy, is then sputtered over the surface of ground layer 64. It should be noted that the magnetic layer extends continuously from raised zones 46 to recessed zones 44. In contrast, discrete track media formed by etching the magnetic layer typically do not have any magnetic material remaining in the recessed zones. As described in *Advancements in the Development of Plastic Hard Disks With Pre-embossed Servo Patterns*, CORPORATE RESEARCH LABORATORIES, SONY CORPORATION, by D. Dericotte, et al., such discontinuous discrete track media provide a roughly half-strength signal at the interface between recessed zones and raised zones after a simple DC erasing procedure. Discrete track Media having continuous magnetic layers require a two-step erasing process, but provide a full strength signal at the interface between raised and recessed zones.

Protective carbon layer 68 is again sputtered, similar to the process used in deposition of carbon underlayer 62. A thin lubricating layer 70 is then applied over the surface of protective carbon layer 68, as is typically of magnetic recording media. The thickness and composition of ground layer 64, magnetic layer 66, protective carbon layer 68, and lubricating layer 70 are generally typical of high density magnetic recording media.

Figure 5:
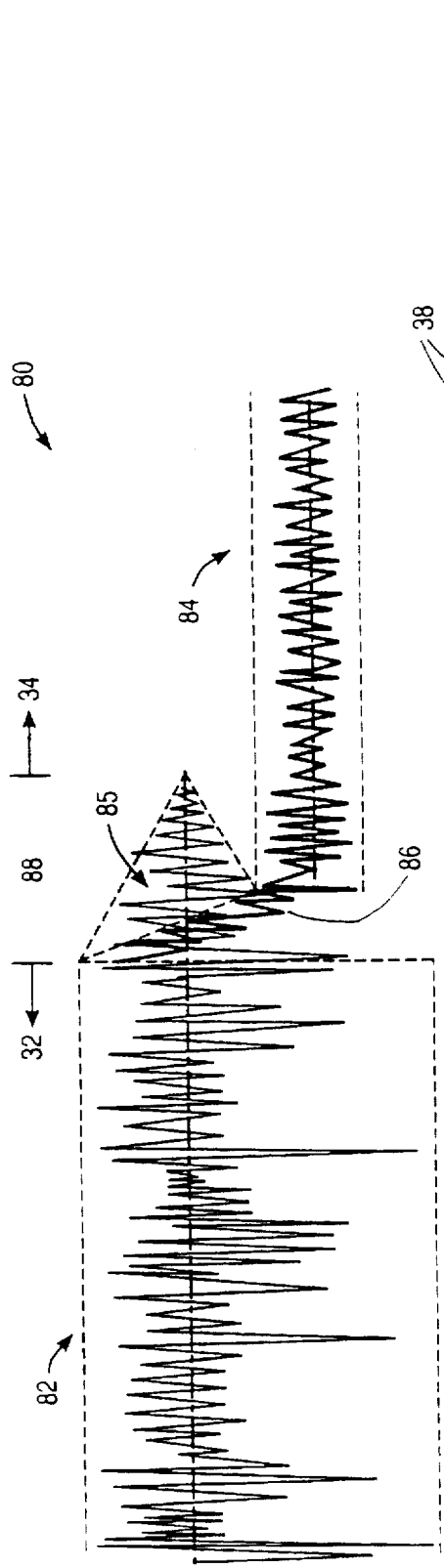
FIG. 5 schematically illustrates the texture of the contact start/stop zone and data zones of the magnetic recording disk of FIG. 2.

Referring now to FIG. 5, a profiler scan 80 of the surface topology of disk 30 illustrates the difference in surface roughness of data zone 34 versus contact start/stop zone 32. Surface topology is generally measured by surface roughness (Ra), which is the arithmetic average of the absolute height and depth of peaks and valleys in such a profiler scan. As explained more fully in copending U.S. patent application Ser. No. 08/503,785, the full disclosure of which has previously been incorporated herein by reference, recording densities generally benefit from the low glide heights associated with smooth recording surfaces having a low surface roughness where the head lands on the disk surface. In contrast, reliability of magnetic recording systems generally benefit from increased surface roughness. Physical separation of disk 30 into contact start/stop zone 32 and data zone 34 avoids compromising on the topological characteristics throughout the head interaction surface, and allows independent optimization of a landing texture 82 and a data texture 84.

The underlayer laser ablation of the present invention provides a flexible method for imposing independent textures on zone textured disks. Optionally, both landing texture 82 and data texture 84 are imposed using selective laser ablation as described hereinabove. Data texture 84 is optionally applied both on raised zones 46 of the discrete track pattern, and on recessed zones 44 to improve magnetic recording of zone tracking data (see FIG. 3). Note that the data zone texture 84 refers only to the surface topology of the substantially horizontal recessed zones and raised zones, rather than to the gross changes in height associated with the discrete track pattern.

Optionally, selective laser ablation is used to impose only one of landing texture 82 and data texture 84, preferably the former. Generally, it is preferable to first impose landing texture 82, followed by texturing of the data zone 84. The data zone texturing process promotes the polishing out of a trailing end 85 of the relatively rough landing texture, thereby providing a smooth transition texture 86 to ensure durability. Alternatively, the flexibility of selective laser ablation should allow the imposition of a landing texture 82 over contact start/stop zone 32 after the data texture has been imposed. The precise definition provided by computer controlled laser ablation appears to allow the direct imposition of a transition zone 88 with a surface roughness which varies smoothly between contact start/stop zone 32 and data zone 34. Thus, the data texture is optionally applied prior to imposing the discrete track pattern, even on a layer disposed below carbon underlayer 62.

Although the exemplary embodiment has been described in some details byway of illustration and example, for purposes of clarity and understanding, certain modifications will be obvious to those who skill in the art. For example, the discrete servo track pattern may be imposed in part using laser ablation of a carbon underlayer, and in part using known lithographic or stamping processes, within the scope of the present invention. Therefore, the scope of the invention is limited solely by the appended claims.

What is claimed is:

1. A method for fabricating magnetic recording media comprising:

depositing an underlayer over a substrate surface;

laser ablating the underlayer to produce a surface having a discrete servo track pattern for enhanced read/write head tracking; and depositing a magnetic recording layer over the underlayer.

2. A method as claimed in claim 1, wherein the underlayer depositing step comprises sputtering carbon.

3. A method as claimed in claim 2, wherein the carbon underlayer depositing step comprises sputtering a sputtering source of at least 99.9% pure carbon.

4. A method as claimed in claim 2, further comprising selecting a laser type based on the absorption spectra of carbon.

5. A method as claimed in claim 2, wherein the ablating step comprises removing underlayer material to provide recessed zones and raised zones which are substantially continuous in a circumferential direction, wherein the carbon underlayer thickness at the recessed zones is in the range between 0 Å and 400 Å.

6. A method as claimed in claim 1, wherein the ablating step comprises texturing the underlayer surface to improve recording head glide characteristics.

7. A method as claimed in claim 1, wherein the ablating step comprises texturing a contact start stop zone with a surface roughness greater than a data zone.

8. A method for fabricating magnetic recording media comprising:

depositing an underlayer over a substrate surface, the underlayer comprising carbon;

laser ablating the underlayer to remove the carbon so as to produce recessed zones, the recessed zones being separated by raised zones of the underlayer, the underlayer at the raised zones having a greater thickness than the underlayer at the recessed zones, the recessed zones and the raised zones of the underlayer being substantially continuous in a circumferential direction and defining a discrete servo track pattern for enhanced read/write head tracking;

laser texturing a data zone over the substrate surface with a first surface roughness to improve read/write head glide characteristics;

laser texturing a contact start stop zone over the substrate surface with a second surface roughness greater than the first surface to improve read/write head stiction characteristics; and deposition of a magnetic recording layer over the discrete servo track pattern of the carbon underlayer.

* * * * *